United States Patent
Vampola et al.

(10) Patent No.: US 10,205,064 B2
(45) Date of Patent: Feb. 12, 2019

(54) LIGHT EMITTING DIODES WITH SENSOR SEGMENT FOR OPERATIONAL FEEDBACK

(71) Applicant: Lumileds LLC, San Jose, CA (US)

(72) Inventors: Kenneth John Vampola, Los Altos, CA (US); Frederic Stephane Diana, Santa Clara, CA (US); Alan McReynolds, Los Altos, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/849,909

(22) Filed: Dec. 21, 2017

(65) Prior Publication Data

US 2018/0182927 A1 Jun. 28, 2018

Related U.S. Application Data

(60) Provisional application No. 62/438,357, filed on Dec. 22, 2016.

(30) Foreign Application Priority Data

Mar. 20, 2017 (EP) .................................. 17161812

(51) Int. Cl.
*F21V 9/00* (2018.01)
*H01L 33/46* (2010.01)
(Continued)

(52) U.S. Cl.
CPC ............... *H01L 33/46* (2013.01); *G09G 3/34* (2013.01); *H01L 27/15* (2013.01); *H01L 33/08* (2013.01);
(Continued)

(58) Field of Classification Search
None
See application file for complete search history.

(56) References Cited

U.S. PATENT DOCUMENTS 4,284,884 A 8/1981 Dyment et al.
8,878,227 B2 11/2014 Moosburger et al.
(Continued)

FOREIGN PATENT DOCUMENTS

JP S58-48481 A 3/1983
JP S58-204574 A 11/1983
(Continued)

OTHER PUBLICATIONS

Vincent, "Fundamentals of Infrared and Visible Detector Operation and Testing," John Wiley & Sons, Chapter 7, Edition 2 (Oct. 26, 2015).

*Primary Examiner* — Vip Patel
(74) *Attorney, Agent, or Firm* — Volpe and Koenig, P.C.

(57) ABSTRACT

Light emitting diodes (LEDs) having a sensor segment for operational feedback are described. A semiconductor stack is grown on a sapphire substrate. The semiconductor stack is segmented to form at least two segments, where one segment senses light emissions (photosensor segment) from the other segment (emitter segment). The segmentation is achieved by etching a trench or forming a segmentation layer between the segments. One segment can alternate on a predetermined basis between functioning as a photosensor segment or as an emitter segment. The photosensor segment can detect either a side light ray emitting from the emitter segment or a reflected light ray from a substrate. The photosensor segment generates a current based on the detected light ray. A detector circuit can provide operational feedback based on the sensed current.

20 Claims, 9 Drawing Sheets

(51) Int. Cl.
*H05B 37/02*  (2006.01)
*G09G 3/34*  (2006.01)
*H01L 33/64*  (2010.01)
*H01L 33/50*  (2010.01)
*H01L 33/54*  (2010.01)
*H01L 33/08*  (2010.01)
*H01L 33/38*  (2010.01)
*H01L 27/15*  (2006.01)

(52) U.S. Cl.
CPC .............. *H01L 33/38* (2013.01); *H01L 33/50* (2013.01); *H01L 33/54* (2013.01); *H01L 33/64* (2013.01); *H05B 37/02* (2013.01)

(56) References Cited

U.S. PATENT DOCUMENTS

| | | |
|---|---|---|
| 2010/0001300 A1 | 1/2010 | Raring et al. |
| 2010/0264835 A1 | 10/2010 | Bilenko et al. |
| 2014/0184062 A1 | 7/2014 | Kolodin |
| 2017/0186908 A1 | 6/2017 | Robin et al. |

FOREIGN PATENT DOCUMENTS

| | | |
|---|---|---|
| WO | 2015/057771 | 4/2015 |
| WO | 2015/108488 | 7/2015 |
| WO | 2017/197576 A1 | 11/2017 |

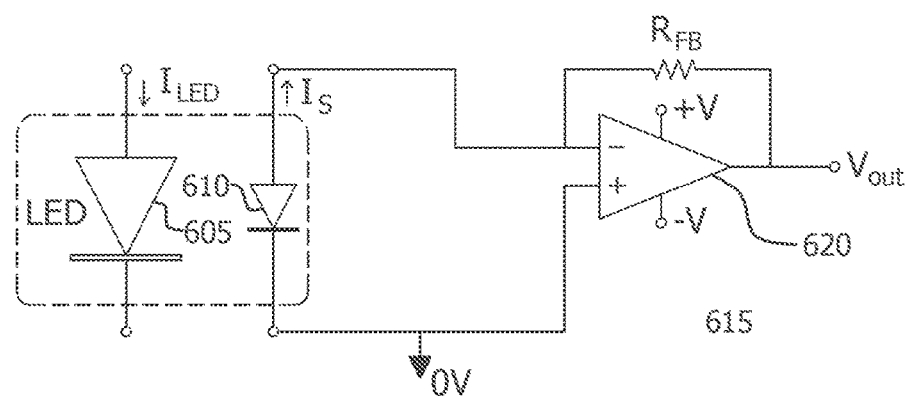
FIG. 6    600
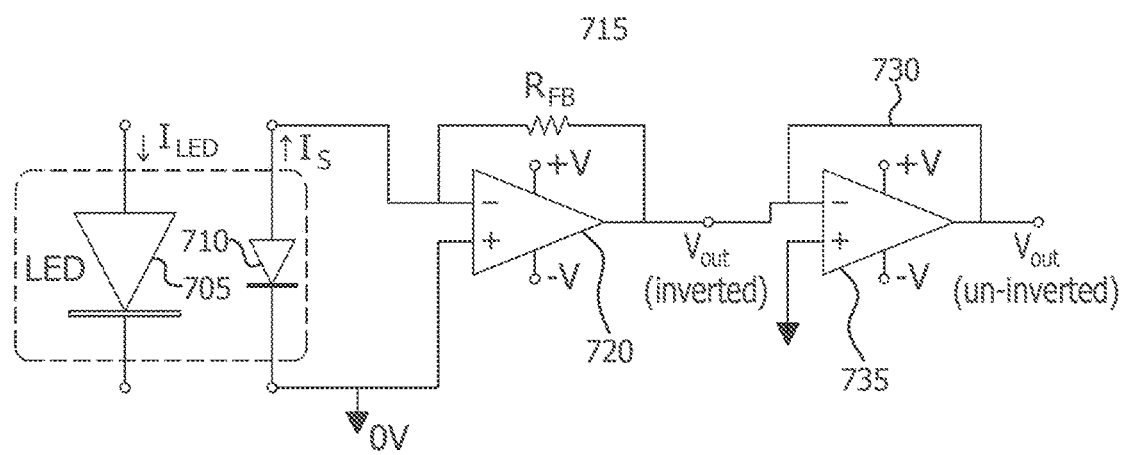
FIG. 7    700

LIGHT EMITTING DIODES WITH SENSOR SEGMENT FOR OPERATIONAL FEEDBACK

CROSS REFERENCE TO RELATED APPLICATIONS

This application claims the benefit of U.S. Provisional Application No. 62/438,357 filed on Dec. 22, 2017 and European Provisional Application No. 17161812.7 filed on Mar. 20, 2017, the contents of which are hereby incorporated by reference herein as if fully set forth.

FIELD OF INVENTION

This application is related to light emitting devices.

BACKGROUND

Photosensors provided proximate to a light emitting diode (LED) die are used to detect the light emissions from the LEDs on the die. The photosensors can be, for example, photodiodes or phototransistors. The current through the photosensor can then be used to detect a LED failure or be used in a feedback loop by a driver to drive the LED to achieve a constant brightness level over time as the LED characteristics change. However, the photosensors must be properly and consistently positioned relative to the LED die in order for the feedback signal to be consistent from product to product. Moreover, the photosensors use real estate on the LED printed circuit board or other area. Furthermore, the photosensors are sensitive to a broad range of light, including ambient light, which affects the accuracy of the photosensors.

SUMMARY

Described herein are light emitting diodes (LEDs) having a sensor segment for operational feedback. In general, the LED layers are formed or grown on a sapphire substrate, where the LED layers can be, for example, Gallium nitride (GaN) layers. In an example, the LED emits blue light. The LED layers are segmented, separated or isolated (collectively referred to as "segmented" herein) to form at least two LED segments. One of the LED segments is used as a photosensor (referred to as photosensor segment herein) with respect to the other LED segment (referred to as emitter segment herein). In an implementation, segmentation can be achieved by etching a trench. In another implementation, segmentation can be achieved by forming, depositing or providing an oxidation layer during LED layer growth. In an implementation, the photosensor may be structurally identical to the emitter segment but has a smaller footprint on the LED die. In an implementation, the photosensor segment alternates on a predetermined basis between functioning as a photosensor segment or as an emitter segment. Electrodes are provided on the LED die for all LED segments. The emitter segment is coupled in a conventional way to a power source for energizing the emitter segment.

In an implementation, a small portion of the light from the emitter segment is transmitted sideways into the photosensor segment, which in turn generates a current. This current is generally proportional to the light emitted by the emitter segment. The current may be used to detect that the emitter segment is operating or may be used as a feedback signal to a driver. The driver uses the feedback signal to adjust the drive current to create a constant light output from the emitter segment over time or as it ages.

In an implementation, the light from the emitter segment is transmitted into the sapphire substrate and due to internal reflection, reflected back to the photosensor segment, which in turn generates a current which can be used as described herein.

In an implementation, the LED layers are segmented to form multiple LED segments, where each segment can represent a particular color. In this implementation, a red emitting segment can be used as the photosensor segment as it has the smallest bandgap.

The photosensor segment is not significantly affected by incident ambient light since the photosensor segment is only sensitive to the narrow emission wavelength of the emitter segment. Even if the emitter segment has an overlying phosphor layer that converts the primary light to white light or another color, the emitter segment still emits its primary color light into the photosensor segment. Moreover, the photosensor segment is always in the same position relative to the emitter segment. Therefore, the photosensor segment has greater accuracy than the conventional photosensors positioned proximate to an LED die.

BRIEF DESCRIPTION OF THE DRAWINGS

A more detailed understanding may be had from the following description, given by way of example in conjunction with the accompanying drawings wherein:

FIG. 6 is an illustrative schematic of a circuit in accordance with certain implementations;

FIG. 7 is yet another illustrative schematic of a circuit in accordance with certain implementations;

DETAILED DESCRIPTION

It is to be understood that the figures and descriptions for light emitting diodes with sensor segments for operational feedback have been simplified to illustrate elements that are relevant for a clear understanding, while eliminating, for the purpose of clarity, many other elements found in typical device processing. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Figure 1:
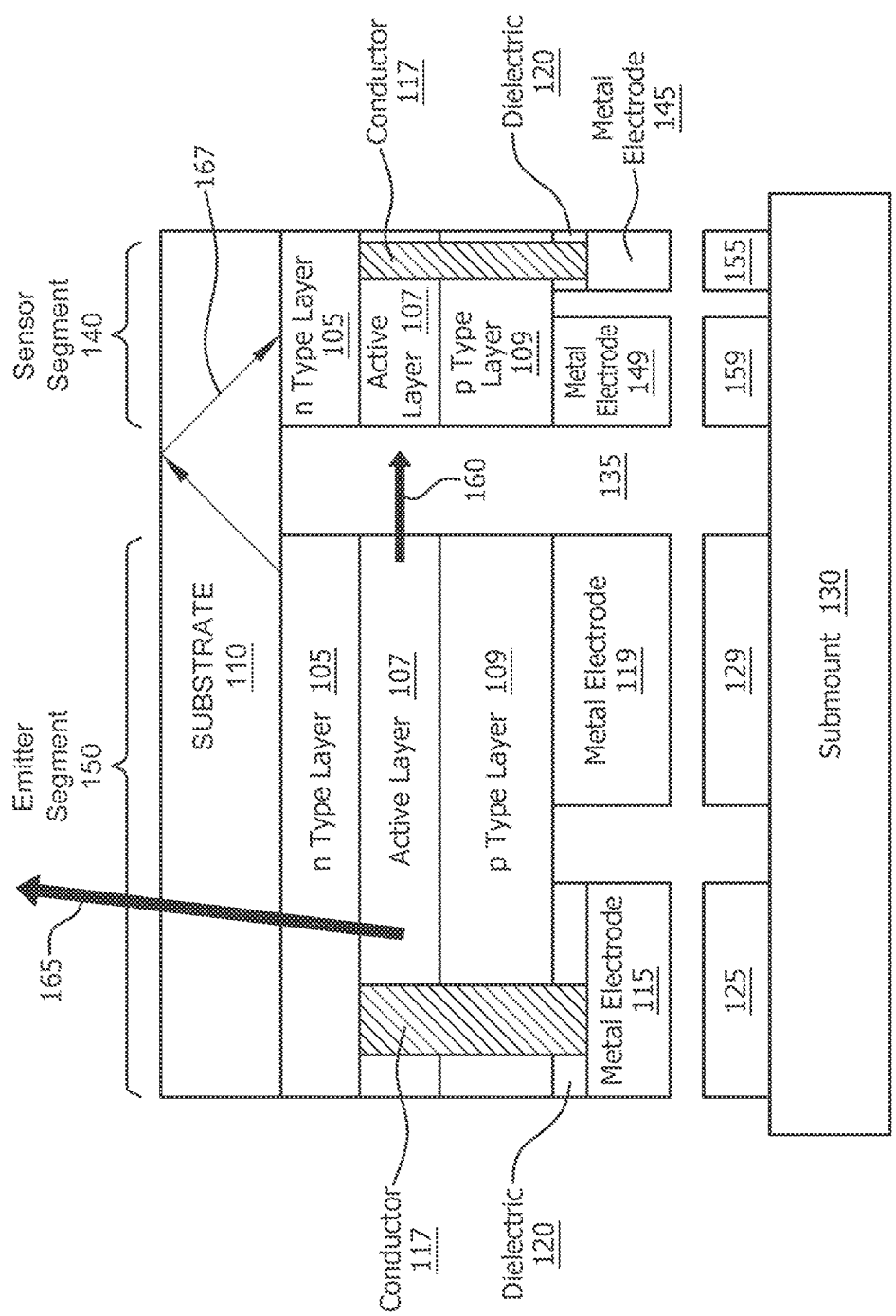
FIG. 1 is an illustrative cross-sectional view of a single LED die, formed as a flip-chip, and a submount, where the LED layers are segmented to form an emitting segment and a sensor segment for detecting the emitter segment's light output in accordance with certain implementations.

FIG. 1 is an illustrative cross-sectional view of a LED die 100 implemented in a flip-chip configuration, where all of the electrodes are on the bottom. In another implementation, a LED die can have one or more electrodes on top and use wire bonds to create the electrical connections. The LED die 100 is formed of semiconductor epitaxial layers, including an n-type layer 105, an active layer 107, and a p-type layer 109, grown on a growth substrate 110. The n-type layer 105, an active layer 107, and a p-type layer 109 may be collectively referred to as a semiconductor stack. In a non-limiting illustrative example, the semiconductor epitaxial layers are made from gallium nitride (GaN), the active layer 107 emits blue light and the growth substrate 110 is a transparent sapphire substrate. The growth substrate 110 may remain or be removed, such as by laser lift-off, etching, grinding, or by other techniques. The growth processes are formed on a wafer scale and the LED dies are then singulated from the wafer. A phosphor layer (not shown) may overlie the growth substrate 110 for converting the blue primary light to white light or any other color light.

A metal electrode 119 electrically contacts the p-type layer 109, and a metal electrode 115 electrically contacts the n-type layer 105 via a vertical conductor 117 through the p-type layer 109 and the active layer 107. A thin dielectric (not shown) insulates the vertical conductor 117 from the p-type layer 109 and the active layer 107. A dielectric layer 120 insulates the metal electrode 115 from the p-type layer 109. In a non-limiting illustrative example, the electrodes 119 and 115 are gold pads that are ultrasonically welded to anode and cathode metal pads 129 and 125 on a ceramic submount 130 or a printed circuit board. In an implementation, the ceramic submount 130 may have conductive vias (not shown) leading to bottom metal pads for bonding to a printed circuit board.

During wafer processing of the LED dies 100, a surface is patterned and etched, using conventional techniques, to form a trench 135, which electrically isolates a photosensor segment 140 from an emitter segment 150. The photosensor segment 140 functions as an embedded sensor in LED dies 100. In an implementation, the trench 135 may be filled with a transparent material to improve the optical coupling between the emitter segment 150 and the photosensor segment 140. The photosensor segment 140 has the exact same layers as the emitter segment 150 and has a vertical conductor 117 connecting its n-type layer 105 to a photosensor electrode 145. The p-type layer 109 of the photosensor segment 140 is connected to a photosensor electrode 149. In an implementation, the photosensor segment 140 will typically have an area that is less than 10% of the emitter segment 150. In an implementation, the photosensor segment 140 may be a small portion along one edge of the emitter segment 150. In another implementation, the photosensor segment 140 may be surrounded by the emitter segment 150. In another implementation, the photosensor segment 140 may take up an entire edge of the LED die 100. The trench 135 surrounds the photosensor segment 140 for complete electrical insulation. In an implementation, electrical isolation may be provided by injection of certain types of atoms around the photosensor segment 140, which causes the GaN material surrounding the photosensor segment 140 to be effectively an insulator.

Figure 2:
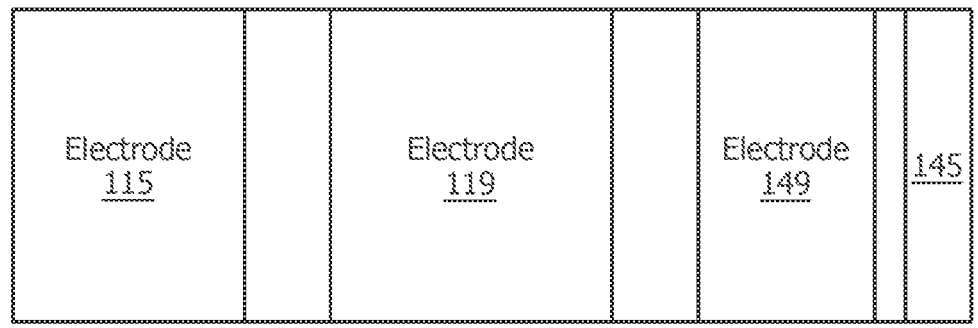
FIG. 2 is an illustrative bottom view of the LED die of FIG. 1 showing four electrodes in accordance with certain implementations.
Figure 3:
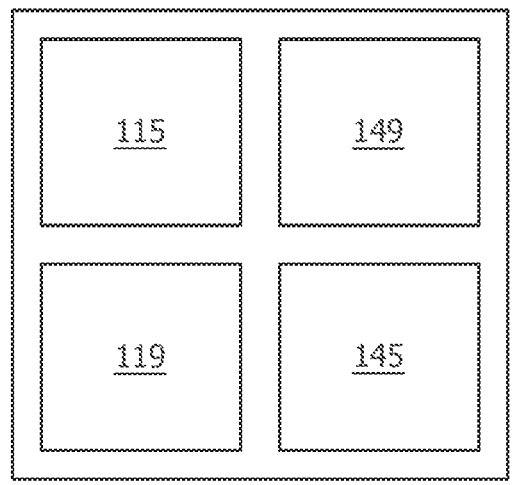
FIG. 3 is another illustrative bottom view of the LED die of FIG. 1 showing four electrodes in accordance with certain implementations.

The photosensor electrodes 145 and 149 contact pads 155 and 159 on the submount 130 or printed circuit board for connection to a detector circuit (shown in FIGS. 4-10). In an implementation, there are four electrodes on the LED die 100 to allow the emitter segment 150 and the photosensor segment 140 to be connected completely independently. FIG. 2 illustrates a bottom view of the LED die 100 of FIG. 1. Electrodes 115 and 119 and photosensor electrodes 149 and 145 are shown as strips. FIG. 3 illustrates an alternative bottom electrode configuration showing the electrodes 115 and 119 and photosensor electrodes 149 and 145 as squares. If the emitter segment 150 and the photosensor segment 140 share a common reference, only three electrodes are needed.

Operationally, side light rays 160 emitted by the emitter segment 150 impinges on the active layer 107 within the photosensor segment 140 and is converted into a small current in a direction opposite to the emitter segment 150 current. The current is the product of the photons exciting the electrons in the photosensor segment's 140 active layer 107. Since the photosensor segment 140 and the emitter segment 150 have the same active layer 107, only the narrow wavelength of light emitted by emitter segment 150 is converted into a small current by the photosensor segment 140. This is beneficial since ambient light will have little effect on the output of the photosensor segment 140. Further, since the photosensor segment 140 is very close to the emitter segment 150, there is little light attenuation in the gap. Accordingly, the system is very efficient, reproducible, and accurate. The vertical conductor 117 is preferably located away from the emitter segment 150 to not attenuate the light. A blue light ray 165 exiting the top of the emitter segment 150 may be converted by a phosphor layer to any other color. Such a phosphor layer does not affect the operation of the photosensor segment 140.

In an implementation where the substrate 110 is not removed, totally internally reflected and Fresnel reflected light rays 167 are reflected back to the photosensor segment 1240 and are converted into a current in a direction opposite to the emitter segment 1250 current as described herein.

Figure 4:
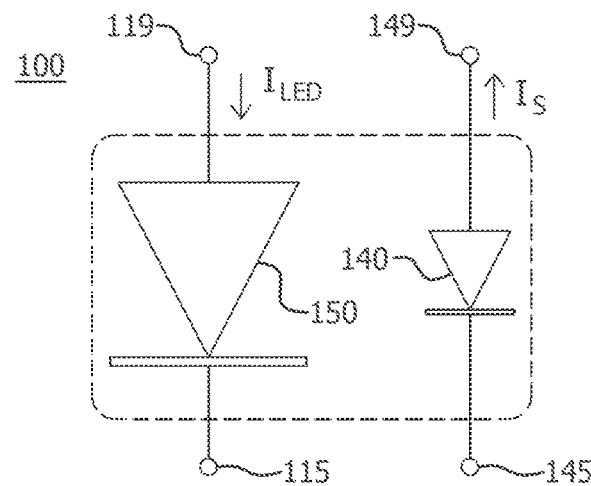
FIG. 4 is an illustrative schematic of the LED and sensor of FIG. 1 in accordance with certain implementations.

FIG. 4 is an illustrative schematic of the LED die 100 showing the emitter segment 150 with electrodes 115 and 119 and the photosensor segment 140 with photosensor electrodes 145 and 149. The direction of forward current $I_{LED}$ into the emitter segment 150 to energize the emitter segment 150 is shown along with the current $I_S$ being generated by the photosensor segment 140 flowing in the opposite direction.

Figure 5:
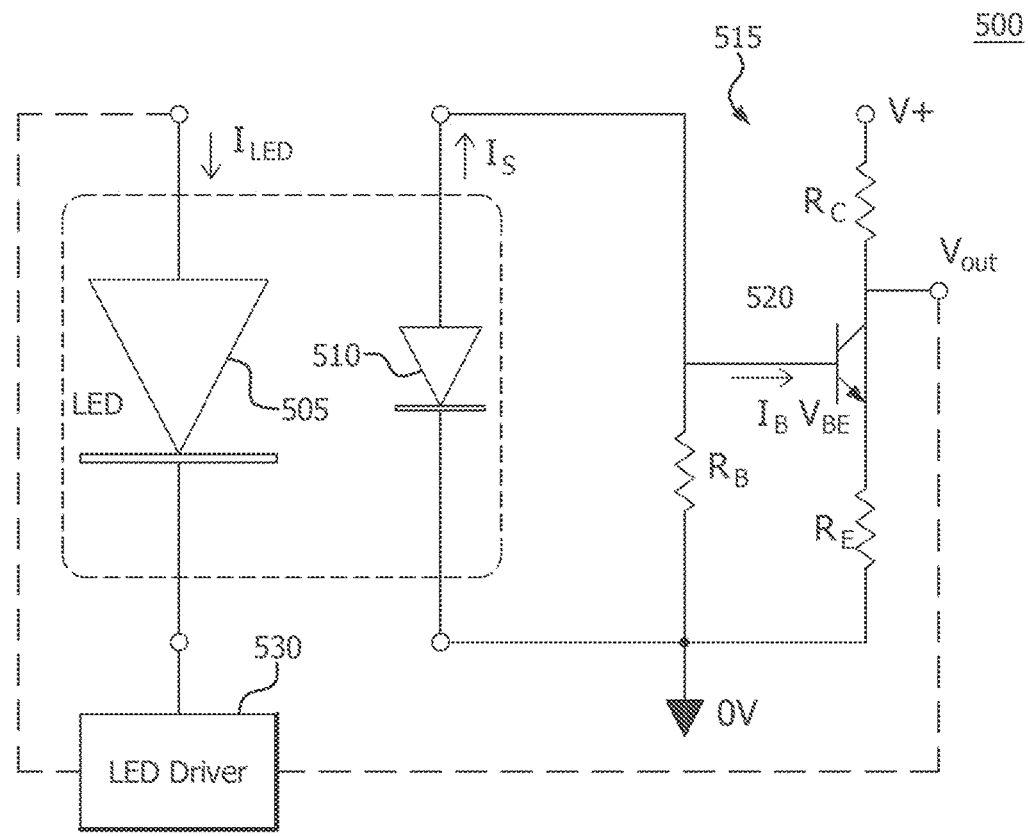
FIG. 5 is an illustrative schematic of an operational feedback circuit in accordance with certain implementations.

FIG. 5 is an illustrative schematic of an operational feedback circuit 500 in accordance with certain implementations. The operational feedback circuit 500 includes an emitter segment 505, a photosensor segment 510 and a detector circuit 515 that is connected to the photosensor segment 510. Although the photosensor segment 510 independently generates a current, a reverse bias voltage may be applied across it to operate photosensor segment 510 in a linear range so that the photosensor segment 510 output is proportional to the brightness of the emitter segment 505. Such an optional reverse bias voltage is not shown in the circuit 500 for purposes of illustration.

The detector circuit 515 includes a transistor 520 connected to resistors $R_B$, $R_C$, and $R_E$. An output voltage $V_{out}$ is inversely related to the generated photosensor segment 510 current, which can be directly proportional to the brightness of the emitter segment 505. When there is little or no light, $V_{out}$ will be approximately V+. When the photosensor segment 510 current is large ($V_{CE}$ of transistor 520 is negligible) the ratio of $V_{out}$ to V+ is approximately $R_E/(R_E+R_C)+V_{BE}$. Thus, $V_{out}$ can be used to detect a fault with the emitter segment 505 or can be used as feedback to a LED driver 530 to keep the brightness at the same level despite the characteristics of the emitter segment 505 changing over time. Since the photosensor segment 510 output may be affected by temperature, a temperature compensation circuit may be added (not shown).

FIG. 6 is another illustrative schematic of a circuit 600 in accordance with certain implementations. The circuit 600 includes an emitter segment 605, a photosensor segment 610 and a detector circuit 615 that is connected to the photosensor segment 610. The detector circuit 615 includes an operational amplifier 620 connected to a feedback resistor $R_{FB}$. The output voltage $V_{out}$ is equal to the photosensor segment 615 current $I_S$ multiplied by the feedback resistance, and has a negative magnitude. The feedback resistor $R_{FB}$ can be chosen to adjust the sensitivity of the output voltage $V_{out}$ to the photosensor segment 615 current $I_S$. In this implementation, the photosensor segment 615 is always biased at 0V and the bias does not change with changes in the photosensor segment 615 current $I_S$. If some other voltage bias is desired, that bias should be applied to the "+" input terminal of the operational amplifier 620. The output, $V_{out}$, is inverted with respect to the sensor current $I_S$.

FIG. 7 is another illustrative schematic of a circuit 700 in accordance with certain implementations. The circuit 700 includes an emitter segment 705, a photosensor segment 710 and a detector circuit 715 that is connected to the photosensor segment 710. The detector circuit 715 includes an operational amplifier 720 connected to a feedback resistor $R_{FB}$. The output voltage $V_{out}$ is equal to the photosensor segment 715 current $I_S$ multiplied by the feedback resistance, and has a negative magnitude. The feedback resistor $R_{FB}$ can be chosen to adjust the sensitivity of the output voltage $V_{out}$ to the photosensor segment 715 current $I_S$. In this implementation, the photosensor segment 715 is always biased at 0V and the bias does not change with changes in the photosensor segment 715 current $I_S$. If some other voltage bias is desired, that bias should be applied to the "+" input terminal of the operational amplifier 720. At this point, the output, $V_{out}$, is inverted with respect to the sensor current $I_S$. The output, $V_{out}$, is input to an inverting circuit 730 to un-invert $V_{out}$. In an implementation, inverting circuit 730 is an operational amplifier 735.

Figure 8:
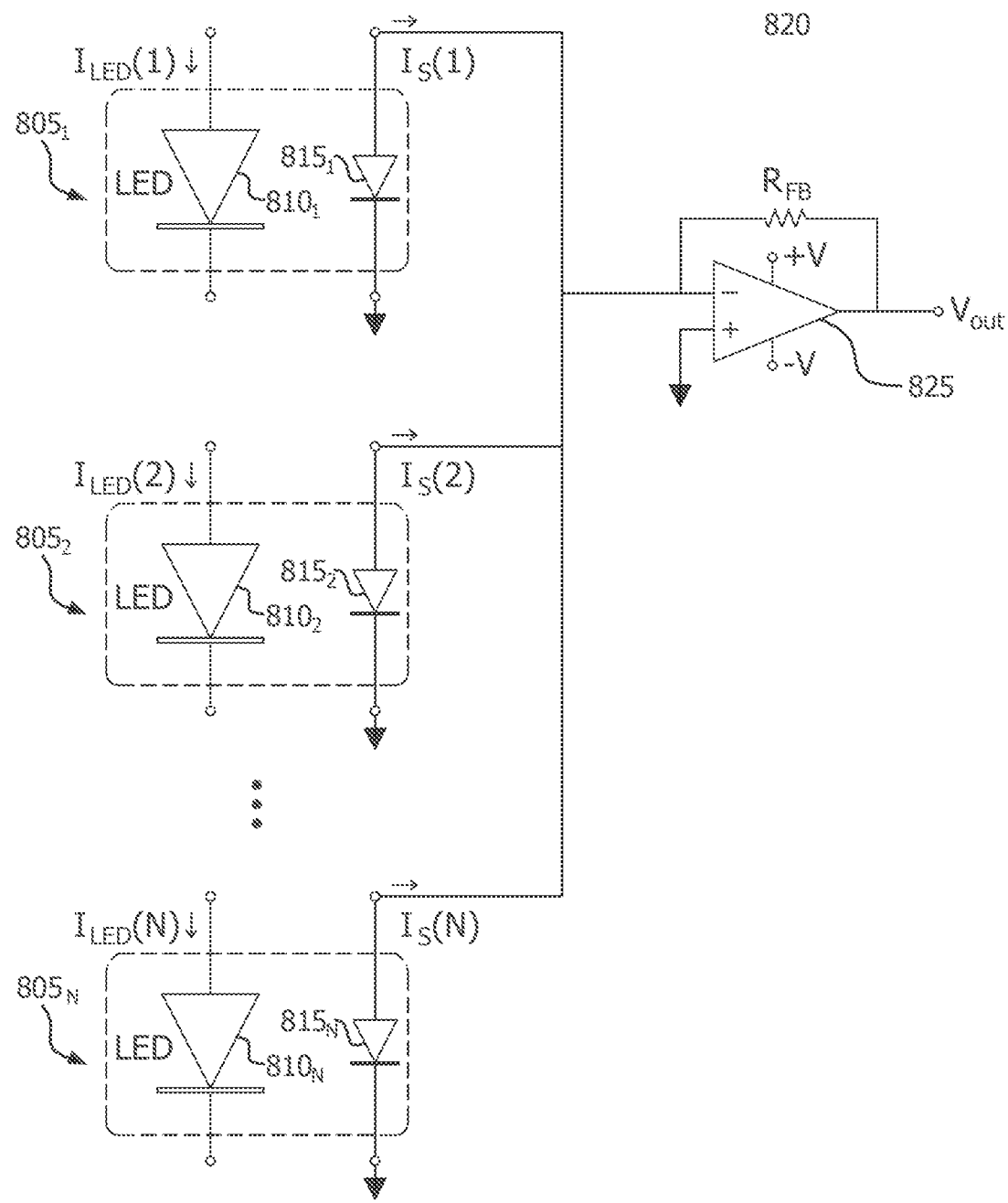
FIG. 8 is an illustrative schematic for connecting multiple sensors on multiple LED dies to a detector in accordance with certain implementations.

FIG. 8 is an illustrative schematic of a circuit 800 for connecting multiple sensors on multiple LED dies to a detector in accordance with certain implementations. The circuit 800 includes multiple LED dies $805_1$-$805_N$, each of which includes an emitter segment $810_1$-$810_N$ and a photosensor segment $815_1$-$815_N$. Each photosensor segment $815_1$-$815_N$ is connected to a detector circuit 820. In an implementation, each photosensor segment $815_1$-$815_N$ is connected to an input of an operational amplifier 825. The circuit 800 ensures that, during normal operation, each photosensor segment $815_1$-$815_N$ is biased at 0V. The output voltage $V_{out}$ is equal to the negative of the sum of all the individual photosensor segment $815_1$-$815_N$ currents, multiplied by a feedback resistance $R_{FB}$. This means that the signals from each photosensor segment $815_1$-$815_N$ is added or averaged, multiplied by a constant, and inverted to generate the output voltage $V_{out}$. The biasing circuit of FIG. 8 is illustrative and other schemes are possible without departing from the scope of the specification and claims herein.

While the emitter segment 150 may reduce its brightness with age (given the same input current), the photosensor segment 140 will change its characteristics at a much slower rate since no high currents are being passed through it. Also, the optical flux and temperature should be lower than what the emitter segment 150 is exposed to. As a result, the response of the photosensor segment 140 is expected to be more stable over time than the response of the emitter segment 150. The flux dependence and temperature dependence of the photosensor segment 140 may be different from that of the emitter segment 150.

As described and illustrated in FIGS. 6-8, the output of the detector circuits can be used in a feedback loop using the LED driver. For instance, the current output of the driver can be made equal to some nominal value plus an additional current that is inversely proportional to the sensor current (or proportional to the inverted output of one of the inverting sensor circuits). The feedback will adjust the drive current until the light generated reaches the desired value. The amount of light generated (proportional to driver current) can be controlled by adjusting the nominal current, or the degree of feedback. The amount of feedback can be adjusted by adjusting the feedback resistor $R_{FB}$ in FIGS. 6-8 or it can be adjusted in the driver circuit.

One advantage of providing this feedback is that the drive current can automatically be increased as the LED (emitter segment) ages. During LED aging, the output power changes, usually by decreasing. Providing optical-based feedback to the LED driver can allow the LED driver to compensate, keeping the light output constant over the lifetime of the device. The LED can maintain a very constant light output for a relatively long time. Depending on the amount that the LED driver adjusts the output, the LED driver may stop increasing the current at some point. After this point is reached, the LED light output would start decreasing with time. On the other hand, if the LED driver never stops increasing the current to compensate for the aging of the LED, the LED will maintain a constant light output until it fails catastrophically. This may be a benefit since the catastrophic failure will signal the user to replace the unit.

Since the LED light output remains constant for a long period, the LED may be driven harder and closer to the drive current failure limit. More light will be generated from a single LED, and the cost per unit optical flux will be reduced. Similarly, the LED can be driven at a hotter temperature, closer to the temperature failure limit, reducing the cost of the heat sink.

For the case of the ultimate low-cost light source, this feedback can allow the LED to operate at a high temperature and high current density. This reduces the cost of the heat sink and reduces the number of LEDs required. The LED will operate at a constant light output until a catastrophic failure.

This method of providing feedback should be useful in many applications, such as automotive, direct colors, and illumination where the failure mode is flux degradation.

If the photosensor output current can be made relatively independent of temperature, then this feedback can also stabilize the LED output over changes in operating temperature.

It is also possible to integrate the signal from the photosensor segment for some period of time, equivalent to integrating the light output of the emitter segment. This can give information about the dose of light. For example, the emitter segment can remain on until a certain number of photons have been collected, and then a signal is sent to the LED driver to turn the emitter segment off. This might find an application in LEDs for camera flash applications. For examples of integrating circuits that bias a sensor and read-out the integrated signal, see chapter 7 of "Fundamentals of Infrared and Visible Detector Operation and Testing" by John David Vincent, John Vampola, Greg Pierce, Steve Hodges, Mark Stegall, the contents of which are incorporated herein.

The photosensor segment 150 can be used to send a signal if a pre-determined amount of flux is not being generated in the emitter segment 140. For example, the output can be made to be negative during normal operation and positive when there is a fault. It is also possible to make the output close to 0V or some reference voltage during normal operation and some other voltage when there is a fault.

Figure 9:
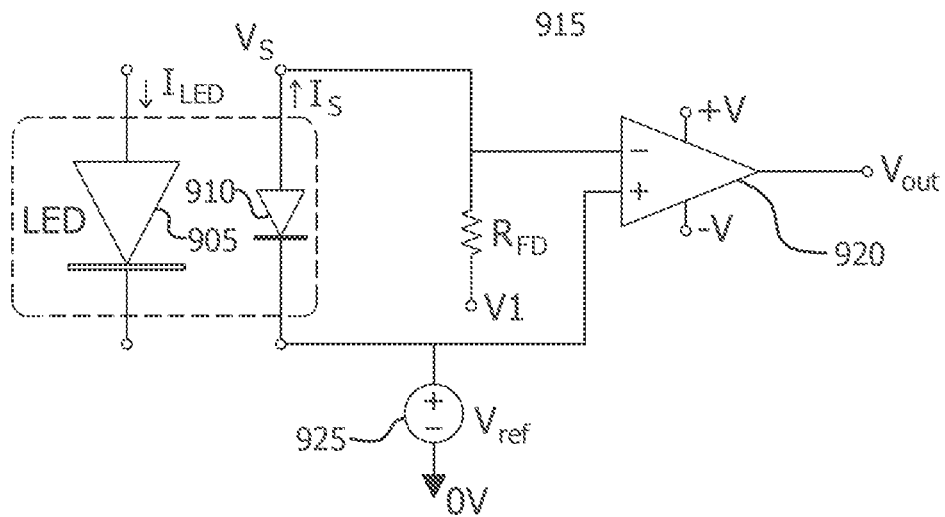
FIG. 9 is an illustrative schematic of a circuit in accordance with certain implementations.

FIG. 9 is an illustrative schematic of a circuit 900 in accordance with certain implementations. The circuit 900 includes an emitter segment 905, a photosensor segment 910 and a detector circuit 915 that is connected to the photosensor segment 910. The detector circuit 915 includes an operational amplifier 920 connected to a voltage source 925 at a positive input terminal and connected to a resistor $R_{FD}$ at a negative input terminal. The detector circuit 915 provides a negative voltage output when the emitter segment 905 is operating normally, with enough flux and provides a positive voltage when there is a fault (i.e., not enough flux is being generated by the emitter segment 905). The resistor $R_{FD}$, $V_{REF}$, and V1 are chosen to adjust the minimum acceptable sensor current $I_S(min)=(V_{REF}-V1)/R_{FD}$. V1 is a voltage used to bias resistor $R_{FD}$. V1 should be less than $V_{REF}$ plus the sensor open-circuit voltage and can be set to 0V, −V, or $V_{REF}$.

Figure 10:
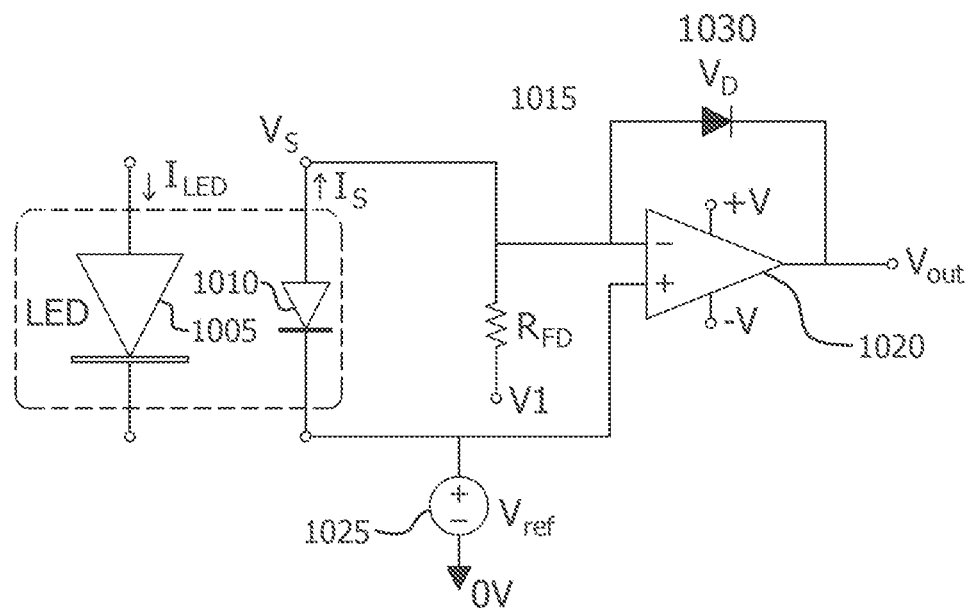
FIG. 10 is yet another illustrative schematic of an operational feedback circuit in accordance with certain implementations.

FIG. 10 is an illustrative schematic of a circuit 1000 in accordance with certain implementations. The circuit 1000 includes an emitter segment 1005, a photosensor segment 1010 and a detector circuit 1015 that is connected to the photosensor segment 1010. The detector circuit 1015 includes an operational amplifier 1020 connected to a voltage source 1025 at a positive input terminal and connected to a resistor $R_{FD}$ at a negative input terminal. A feedback diode 1030 is connected between an output of the operational amplifier 1020 and the negative input terminal of the operational amplifier 1020. The detector circuit 1015 provides, during normal operation, an output voltage, $V_{out}$, equal to the reference voltage $V_{REF}$ minus the turn-on voltage of the feedback diode 1020, $V_{FD}$. During a fault, $V_{out}$ is close to the positive rail voltage. In this implementation, the photosensor segment 1010 is biased at 0V during normal operation. These circuits are illustrative and other circuits are envisioned without departing from the scope of the specification and claims herein.

Figure 11:
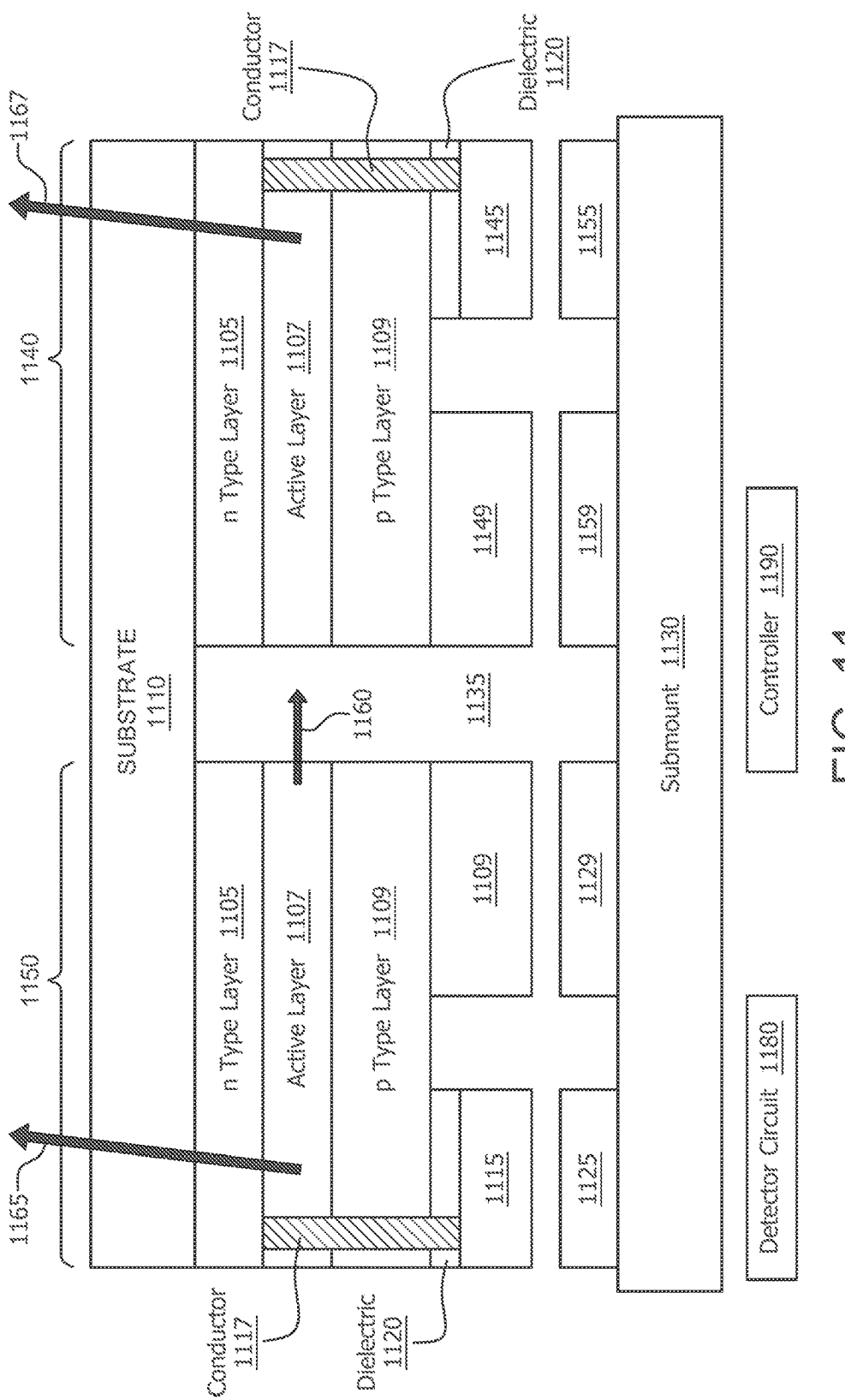
FIG. 11 is another illustrative cross-sectional view of a single LED die and a submount, where the LED layers are segmented to form an emitting segment and a dual purpose emitter segment/sensor segment for detecting the emitter segment's light output in accordance with certain implementations.

FIG. 11 is an illustrative cross-sectional view of a LED die 1100 implemented in a flip-chip configuration, where all of the electrodes are on the bottom. In another implementation, a LED die can have one or more electrodes on top and use wire bonds to create the electrical connections. The LED die 1100 is formed of semiconductor epitaxial layers, including an n-type layer 1105, an active layer 1107, and a p-type layer 1109, grown on a growth substrate 1110. In a non-limiting illustrative example, the semiconductor epitaxial layers are made from gallium nitride (GaN), the active layer 1107 emits blue light and the growth substrate 1110 is a transparent sapphire substrate. The growth substrate 110 may remain or be removed, such as by laser lift-off, etching, grinding, or by other techniques. The growth processes are formed on a wafer scale and the LED dies are then singulated from the wafer. A phosphor layer (not shown) may overlie the growth substrate 1110 for converting the blue primary light to white light or any other color light.

A metal electrode 1119 electrically contacts the p-type layer 1109, and a metal electrode 1115 electrically contacts the n-type layer 1105 via a vertical conductor 1117 through the p-type layer 1109 and the active layer 1107. A thin dielectric (not shown) insulates the vertical conductor 1117 from the p-type layer 1109 and the active layer 1107. A dielectric layer 1120 insulates the metal electrode 1115 from the p-type layer 1109. In a non-limiting illustrative example, the electrodes 1119 and 1115 are gold pads that are ultrasonically welded to anode and cathode metal pads 1129 and 1125 on a ceramic submount 1130 or a printed circuit board. In an implementation, the ceramic submount 1130 may have conductive vias (not shown) leading to bottom metal pads for bonding to a printed circuit board.

During wafer processing of the LED dies 1100, a surface is patterned and etched, using conventional techniques, to form a trench 1135, which electrically isolates a dual purpose segment 1140 from an emitter segment 1150. The dual purpose segment 1140 functions as an embedded sensor and as an emitter in LED dies 1100. In an implementation, the trench 1135 may be filled with a transparent material to improve the optical coupling between the emitter segment 1150 and the dual purpose segment 1140. The dual purpose segment 1140 has the exact same layers as the emitter segment 1150 and has a vertical conductor 1117 connecting its n-type layer 1105 to a dual purpose electrode 1145. The p-type layer 1109 of the dual purpose segment 1140 is connected to a dual purpose electrode 1149. The trench 1135 surrounds the dual purpose segment 1140 for complete electrical insulation. In an implementation, electrical isolation may be provided by injection of certain types of atoms around the dual purpose segment 1140, which causes the GaN material surrounding the dual purpose segment 1140 to be effectively an insulator.

The dual purpose electrodes 1145 and 1149 are connected to contact pads 1155 and 1159 on the submount 1130 or printed circuit board for connection to a detector circuit 1180 (details shown in FIGS. 4-10). In an implementation, there are four electrodes on the LED die 1100 to allow the emitter segment 1150 and the photosensor segment 1140 to be connected completely independently.

In an implementation, the dual purpose segment 1140 is switched between operating as a photosensor or as an emitter on a periodic basis. In an implementation, the dual purpose segment 1140 is switched between operating as a photosensor or as an emitter on an on-demand basis. In an implementation, a controller 1190 can operate dual purpose segment 1140 as a photosensor as described herein or as an emitter such as emitter segment 1150. The controller 1190 can be connected to the dual purpose segment 1140 via the submount 1130 and the dual purpose electrodes 1145 and 1149 and contact pads 1155 and 1159.

Operationally, when the dual purpose segment 1140 is operating as a photosensor, side light 1160 emitted by the emitter segment 1150 impinges on the active layer 1107 within the dual purpose segment 1140 and is converted into a small current in a direction opposite to the emitter segment 1150 current. The current is the product of the photons exciting the electrons in the dual purpose segment's 1140 active layer 1107. Since the dual purpose segment 1140 and the emitter segment 1150 have the same active layer 1107, only the narrow wavelength of light emitted by emitter segment 1150 is converted into a small current by the dual purpose segment 1140. This is beneficial since ambient light will have little effect on the output of the dual purpose segment 1140. Further, since the dual purpose segment 1140 very close to the emitter segment 1150, there is little light attenuation in the gap. Accordingly, the system is very efficient, reproducible, and accurate. The vertical conductor 1117 is preferably located away from the emitter segment 1150 to not attenuate the light. A blue light ray 1165 exiting the top of the emitter segment 1150 may be converted by a phosphor layer to any other color. Such a phosphor layer does not affect the operation of the dual purpose segment 1140. When the dual purpose segment 1140 is operating as an emitter, a blue light ray 1167 exiting the top of the dual purpose segment 1140 may be converted by a phosphor layer to any other color.

Figure 12:
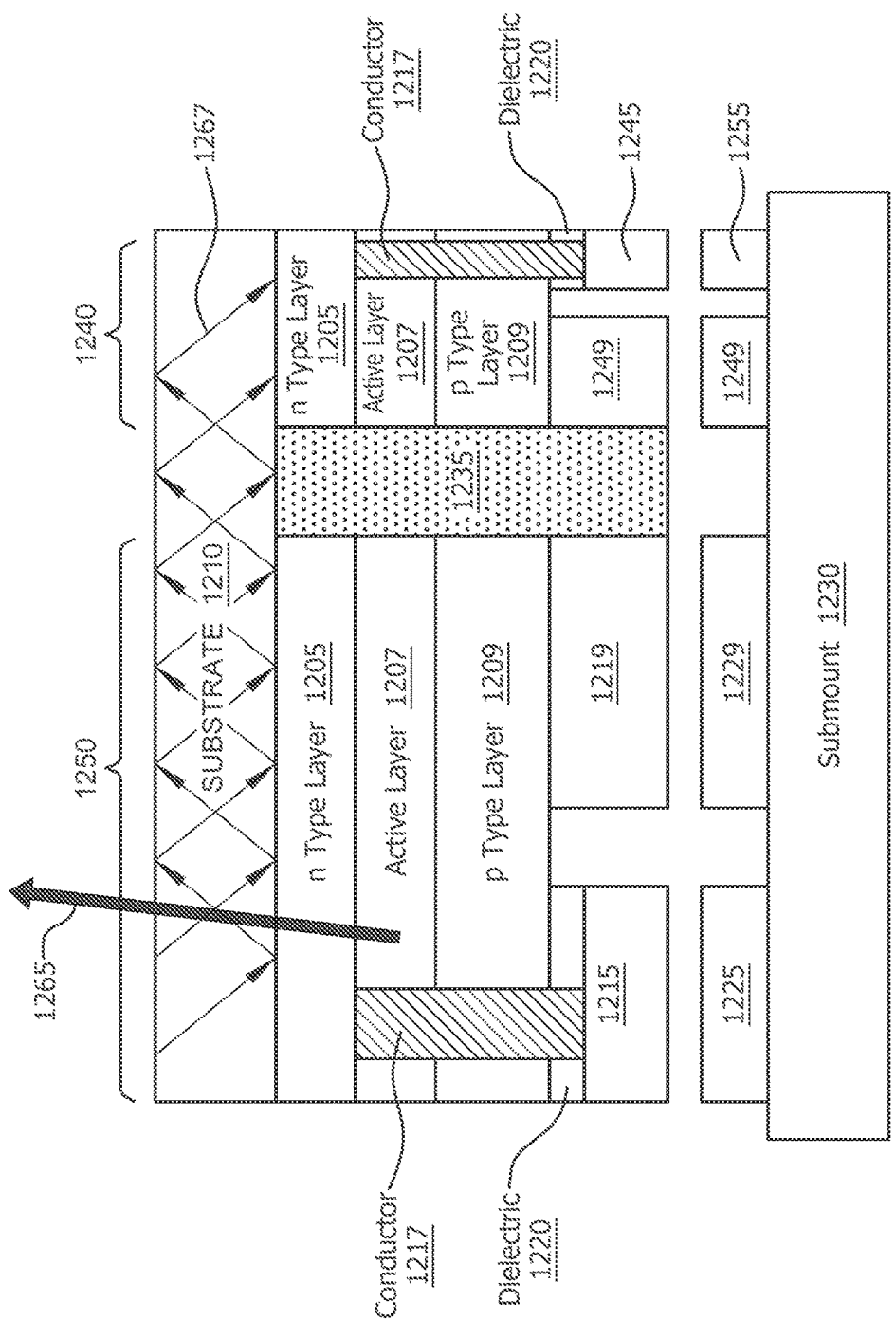
FIG. 12 is another illustrative cross-sectional view of a single LED die and a submount, where the LED layers are segmented to form an emitting segment and a sensor segment for detecting the emitter segment's light output in accordance with certain implementations.

FIG. 12 is an illustrative cross-sectional view of a LED die 1200 implemented in a flip-chip configuration, where all of the electrodes are on the bottom. In another implementation, a LED die can have one or more electrodes on top and use wire bonds to create the electrical connections. The LED die 1200 is formed of semiconductor epitaxial layers, including an n-type layer 1205, an active layer 1207, and a p-type layer 1209, grown on a growth substrate 1210. In a non-limiting illustrative example, the semiconductor epitaxial layers are made from gallium nitride (GaN), the active layer 1207 emits blue light and the growth substrate 1210 is a transparent sapphire substrate. The growth substrate 1210 may remain or be removed, such as by laser lift-off, etching, grinding, or by other techniques. The growth processes are formed on a wafer scale and the LED dies are then singulated from the wafer. A phosphor layer (not shown) may overlie the growth substrate 1210 for converting the blue primary light to white light or any other color light.

A metal electrode 1219 electrically contacts the p-type layer 1209, and a metal electrode 1215 electrically contacts the n-type layer 1205 via a vertical conductor 1217 through the p-type layer 1209 and the active layer 1207. A thin dielectric (not shown) insulates the vertical conductor 1217 from the p-type layer 1209 and the active layer 1207. A dielectric layer 1220 insulates the metal electrode 1215 from the p-type layer 1209. In a non-limiting illustrative example, the electrodes 1219 and 1215 are gold pads that are ultrasonically welded to anode and cathode metal pads 1229 and 1225 on a ceramic submount 1230 or a printed circuit board. In an implementation, the ceramic submount 1230 may have conductive vias (not shown) leading to bottom metal pads for bonding to a printed circuit board.

During wafer processing of the LED dies 1200, a segmentation layer 1235 electrically and optically isolates and/or insulates a photosensor segment 1240 from an emitter segment 1250. In an implementation, the segmentation layer 1235 electrically and optically isolates and/or insulates the photosensor segment 1240 from the emitter segment 1250 to maximize light output. In an implementation, additional layers may be added in conjunction with the segmentation layer 1235 to focus or direct light rays out of the emitter segment 150. In an implementation, the segmentation layer 1235 is an oxide layer that is deposited using conventional techniques including, for example, patterning a surface, masking and depositing a given material as is known in the art. In an implementation, the segmentation layer 1235 is formed by ion implantation. The photosensor segment 1240 functions as an embedded sensor in LED dies 1200. The photosensor segment 1240 has the exact same layers as the emitter segment 1250 and has a vertical conductor 1217 connecting its n-type layer 1205 to a photosensor electrode 1245. The p-type layer 1209 of the photosensor segment 1240 is connected to a photosensor electrode 1249. In an implementation, the photosensor segment 1240 will typically have an area that is less than 10% of the emitter segment 1250. In an implementation, the photosensor segment 1240 may be a small portion along one edge of the emitter segment 1250. In another implementation, the photosensor segment 1240 may be surrounded by the emitter segment 1250. In another implementation, the photosensor segment 1240 may take up an entire edge of the LED die 1200.

Operationally, a blue light ray 1265, for example, is emitted from the top of the emitter segment 1250 into the growth substrate 1210. Totally internally reflected and Fresnel reflected light rays 1267 are reflected back to the photosensor segment 1240 and are converted into a current in a direction opposite to the emitter segment 1250 current. The current is the product of the photons exciting the electrons in the photosensor segment's 1240 active layer 1207. Since the photosensor segment 1240 and the emitter segment 1250 have the same active layer 1207, only the narrow wavelength of light emitted by emitter segment 1250 is converted into the current by the photosensor segment 1240. This is beneficial since ambient light will have little effect on the output of the photosensor segment 1240. The vertical conductor 1217 is preferably located away from the emitter segment 1250 to not attenuate the light. The blue light ray 1265 exiting the top of the emitter segment 1250 may be converted by a phosphor layer to any other color. Such a phosphor layer does not affect the operation of the photosensor segment 1240.

The photosensor electrodes 1245 and 1249 contact pads 1255 and 1259 on the submount 1230 or printed circuit board for connection to a detector circuit (shown in FIGS. 4-10). In an implementation, there are four electrodes on the LED die 1200 to allow the emitter segment 1250 and the photosensor segment 1240 to be connected completely independently.

Each of the implementations described herein can be used with the techniques of other implementations. For example, the implementation of FIG. 11 can be implemented with the insulation layer described in FIG. 12.

In an implementation, a LED die can be segmented into multiple segments, where one segment functions as a photosensor. In this implementation, the segment functioning as a photosensor used to sense the performance for all emitter segments. In an implementation, each segment could emit a different color. In an implementation, a red emitting emitter segment acts as the photosensor as the red emitting emitter segment has the smallest bandgap.

For the implementations described herein, normally, when LEDs are connected in series, fault detection is done by comparing the LED string voltage to an expectation. However, many voltage sensing circuits assume that the fault is a short circuit or assume that the fault is an open circuit. Also, voltage-sensing fault detection circuits are affected by changes in the LED voltage that occur over the lifetime of the device. The present invention results in an optical-based fault detection or feedback. It is the light that is being sensed, not the voltage. This optical-based fault detection scheme does not require an assumption that the failure will be an open or a short. Also, it is not affected by changes to the operating voltage over the lifetime of the device.

With the sensor diode electrodes being separate from the LED electrodes, it is also possible to wire the LED and the sensor together. If they are wired in parallel, then the sensor diode generates light, along with the LED, making the device more efficient. When they are wired anti-parallel, the sensor diode acts like a transient voltage suppression diode. One advantage of having the LED and sensor electrodes being separate on the die is that the connection configuration happens not on the LED chip, but on the submount or printed circuit board. Different submount configurations can result in the parallel connection for higher efficiency, anti-parallel configuration for transient voltage suppression, or independently wired for use as an LED and sensor.

In another embodiment, the sensor is a separately formed die that is smaller than the LED die, but having the same semiconductor layers. The sensor chip is mounted in the same package as the LED chip to maintain a predetermined positional relationship. The package then has the four electrodes, such as shown in FIG. 2 or 3.

Figure 13:
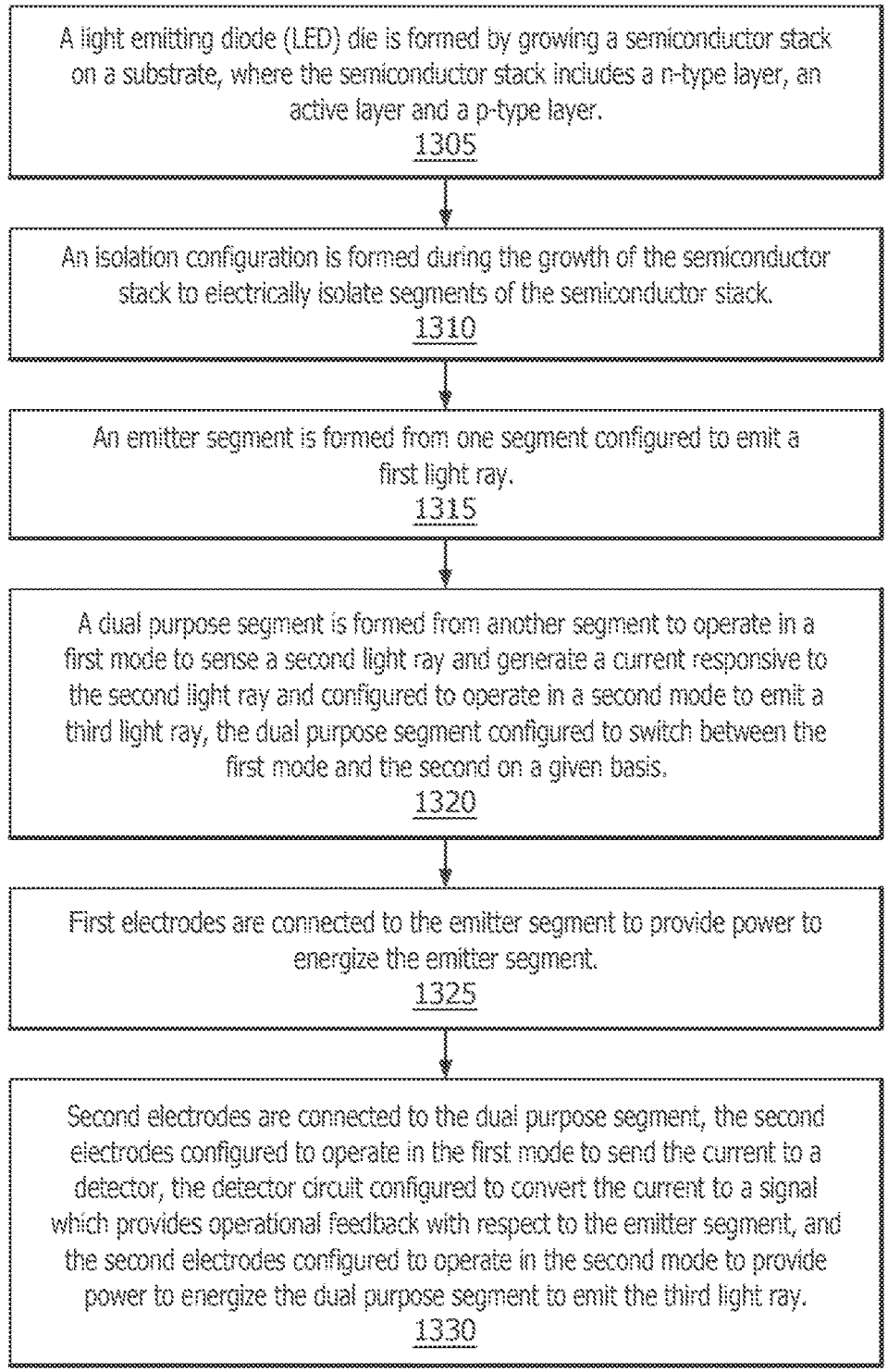
FIG. 13 is a flowchart for making LEDs with sensor segments in accordance with certain implementations.

FIG. 13 is a flowchart for making a light emitting device in accordance with certain implementations. A light emitting diode (LED) die is formed by growing a semiconductor stack on a substrate, where the semiconductor stack includes an n-type layer, an active layer and a p-type layer (1305). An isolation configuration is formed during the growth of the semiconductor stack to electrically isolate segments of the semiconductor stack (1310). In an implementation, the isolation configuration optically isolates the segments. In an implementation, the isolation configuration is a trench. In an implementation, the isolation configuration is an insulation barrier implemented via ion implantation or an oxidation process. An emitter segment is formed from one segment configured to emit a first light ray (1315). A dual purpose segment is formed from another segment to operate in a first mode to sense a second light ray and generate a current responsive to the second light ray and configured to operate in a second mode to emit a third light ray, the dual purpose segment configured to switch between the first mode and the second on a given basis (1320). First electrodes are connected to the emitter segment to provide power to energize the emitter segment (1325). Second electrodes are connected to the dual purpose segment, the second electrodes configured to operate in the first mode to send the current to a detector, the detector circuit configured to convert the current to a signal which provides operational feedback with respect to the emitter segment, and the second electrodes configured to operate in the second mode to provide power to energize the dual purpose segment to emit the third light ray (1330).

The embodiments described herein may be incorporated into any suitable light emitting device. Embodiments of the invention are not limited to the particular structures illustrated, such as, for example, the devices of FIGS. 1-13.

Though in the examples and embodiments described above the semiconductor light emitting device is a III-nitride LED that emits blue or UV light, semiconductor light emitting devices besides LEDs, such as laser diodes, are within the scope of the invention. In addition, the principles described herein may be applicable to semiconductor light emitting devices made from other materials systems such as other III-V materials, III-phosphide, III-arsenide, II-VI materials, ZnO, or Si-based materials.

The non-limiting methods described herein for light emitting diodes with sensor segments for operational feedback may be modified for a variety of applications and uses while remaining within the spirit and scope of the claims. The implementations and variations described herein, and/or shown in the drawings, are presented by way of example only and are not limiting as to the scope and spirit. The descriptions herein may be applicable to all implementations of the method for using and making light emitting diodes with sensor segments for operational feedback although it may be described with respect to a particular implementation.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the method for using and making light emitting diodes with sensor segments for operational feedback as described herein, and are considered to be within the full scope of the invention.

Some features of some implementations may be omitted or implemented with other implementations. The device elements and method elements described herein may be interchangeable and used in or omitted from any of the examples or implementations described herein.

Although features and elements are described above in particular combinations, each feature or element can be used alone without the other features and elements or in various combinations with or without other features and elements.

What is claimed is:

1. A light emitting device, comprising:
a detector circuit; and
a light emitting diode (LED) die including:
  a semiconductor stack grown on a substrate, the semiconductor stack including a n-type layer, an active layer and a p-type layer;
  an emitter segment formed from one segment of the semiconductor stack, the emitter segment configured to emit a light ray;
  a photosensor segment formed from another segment of the semiconductor stack, the photosensor segment configured to sense a reflected light ray from the substrate and generate a current responsive to the reflected light ray;
  a segmentation layer formed between the emitter segment and the photosensor segment, the segmentation layer electrically isolating the emitter segment from the photosensor segment;
  first electrodes configured to provide power to energize the emitter segment; and
  second electrodes configured to send the current to the detector circuit, the detector circuit configured to convert the current to a signal which provides operational feedback with respect to the emitter segment.

2. The light emitting device of claim 1, wherein the segmentation layer is an oxide layer.

3. The light emitting device of claim 1, wherein the segmentation layer is an ion implantation layer.

4. The light emitting device of claim 1, wherein the segmentation layer optically isolates the emitter segment from the photosensor segment.

5. A light emitting device, comprising:
a detector circuit; and
a light emitting diode (LED) die including:
   a semiconductor stack grown on a substrate, the semiconductor stack including a n-type layer, an active layer and a p-type layer;
   an emitter segment formed from one segment of the semiconductor stack, the emitter segment configured to emit a first light ray;
   a dual purpose segment formed from another segment of the semiconductor stack, the dual purpose segment configured to operate in a first mode to sense a second light ray and generate a current responsive to the second light ray and configured to operate in a second mode to emit a third light ray, the dual purpose segment configured to switch between the first mode and the second on a given basis;
   an isolation configuration formed between the emitter segment and the dual purpose segment, the isolation configuration electrically isolating the emitter segment from the dual purpose segment;
   first electrodes configured to provide power to energize the emitter segment; and
   second electrodes configured to operate in the first mode to send the current to the detector circuit, the detector circuit configured to convert the current to a signal which provides operational feedback with respect to the emitter segment, and configured to operate in the second mode to provide power to energize the dual purpose segment.

6. The light emitting device of claim 5, wherein the isolation configuration optically isolates the emitter segment from the dual purpose segment.

7. The light emitting device of claim 6, wherein the isolation configuration is a segmentation layer.

8. The light emitting device of claim 7, wherein the segmentation layer is an oxide layer.

9. The light emitting device of claim 8, wherein the second light ray is a reflected light ray from the substrate.

10. The light emitting device of claim 5, wherein the second light ray includes a side light ray emitted from the emitter region and impinging on the active layer of the dual purpose segment.

11. The light emitting device of claim 5, wherein the isolation configuration is a trench.

12. The light emitting device of claim 10, wherein the second light ray is a side light ray emitted from the emitter region and impinging on the active layer of the dual purpose segment.

13. The light emitting device of claim 5, further comprising:
   a controller coupled via the second electrodes, the controller configured to switch the dual purpose segment between the first mode and the second mode.

14. The light emitting device of claim 5, wherein the given basis is a periodic basis.

15. The light emitting device of claim 5, wherein the given basis is an on-demand basis.

16. The light emitting device of claim 5, wherein the operational feedback determines how to regulate a drive current to the emitter region based on sensed light output.

17. A method for making a light emitting device, the method comprising:
providing a light emitting diode (LED) die;
connecting a detector to the LED die,
the LED die being formed by:
   growing a semiconductor stack on a substrate, the semiconductor stack including a n-type layer, an active layer and a p-type layer;
   forming an isolation configuration during the growth of the semiconductor stack to electrically isolate segments of the semiconductor stack;
   forming emitter segments from some segments, the emitter segments configured to emit first light rays;
   forming from a segment a dual purpose segment configured to operate in a first mode to sense a second light ray and generate a current responsive to the second light ray and configured to operate in a second mode to emit a third light ray, the dual purpose segment configured to switch between the first mode and the second on a given basis;
   connecting first electrodes to the emitter segment to provide power to energize the emitter segment; and
   connecting second electrodes to the dual purpose segment, the second electrodes configured to operate in the first mode to send the current to the detector, the detector circuit configured to convert the current to a signal which provides operational feedback with respect to the emitter segment, and the second electrodes configured to operate in the second mode to provide power to energize the dual purpose segment.

18. The method of claim 17, wherein the isolation configuration optically isolates the emitter segment from the dual purpose segment.

19. The method of claim 17, wherein the second light ray is a reflected light ray from the substrate.

20. The method of claim 19, wherein the second light ray includes a side light ray emitted from the emitter region and impinging on the active layer of the dual purpose segment.

* * * * *